United States Patent [19]
Sofia et al.

[11] Patent Number: 4,979,663
[45] Date of Patent: Dec. 25, 1990

[54] OUTER LEAD TAPE AUTOMATED BONDING SYSTEM

[75] Inventors: John W. Sofia, Wakefield; David L. Hallowell, Westford, both of Mass.

[73] Assignee: Digital Equipment Corporation, Maynard, Mass.

[21] Appl. No.: 432,503

[22] Filed: Nov. 7, 1989

Related U.S. Application Data

[60] Division of Ser. No. 219,858, Jul. 14, 1988, Pat. No. 4,899,207, which is a continuation of Ser. No. 900,789, Aug. 27, 1986, abandoned.

[51] Int. Cl.$^5$ .................. B23K 101/40; H05K 3/34; H01L 21/58
[52] U.S. Cl. .................. 228/180.2; 228/212; 228/223; 228/175; 29/834
[58] Field of Search ............ 228/135, 212, 175, 180.2, 228/203, 223, 229, 179, 180.1; 29/832, 834, 464

[56] References Cited

U.S. PATENT DOCUMENTS

| | | | |
|---|---|---|---|
| 3,657,805 | 4/1972 | Johnson | 29/589 |
| 4,466,183 | 8/1984 | Burns | 29/827 |
| 4,604,644 | 8/1986 | Beckham et al. | 228/180.2 |
| 4,645,114 | 2/1987 | Van Den Brekel et al. | 228/180.2 |
| 4,664,309 | 5/1987 | Allen et al. | 228/175 |
| 4,672,418 | 6/1987 | Moran et al. | 357/70 |
| 4,749,120 | 6/1988 | Hatada | 228/180.2 |
| 4,830,264 | 5/1989 | Bitaillou et al. | 228/180.2 |

FOREIGN PATENT DOCUMENTS

| | | |
|---|---|---|
| A0016522 | 2/1980 | European Pat. Off. . |
| 0147807 | 12/1984 | European Pat. Off. . |
| 0233029 | 1/1987 | European Pat. Off. . |
| A3219055 | 8/1983 | Fed. Rep. of Germany . |
| 6124261 | 7/1984 | Japan . |
| 60-165748 | 8/1985 | Japan . |

OTHER PUBLICATIONS

IBM Technical Disclosure Bulletin, vol. 28, No. 5, Oct. 1985, pp. 2237–2238, Armonk, N.Y., U.S.; "Outer lead guard bars for tab".

Patent Abstracts of Japan, vol. 9, No. 143, (E-322) [1866] JA-60-25263, Lead Frame, 6-18-1985.

*Primary Examiner*—Sam Heinrich
*Attorney, Agent, or Firm*—Nutter, McClennen & Fish

[57] ABSTRACT

A method for aligning and bonding the outer leads of the conductive fingers of a tape-and-semiconductor-chip sub-assembly to a package substrate is disclosed. Each section of tape is provided with an inner support ring and an outer support ring. The conductive fingers extend from under the inner support ring to under the outer support ring. The outer support ring is spaced away from the inner support ring to expose portions of the tape outer leads therebetween. The tape-and-chip sub-assembly is positioned over the package substrate so the outer leads are in register with the appropriate package substrate leads. A deposit of flux is applied to at least one location between the substrate and outer support ring to bond the sub-assembly to the substrate. The bonded outer support ring prevents the sub-assembly from moving so the leads do not become out of register with the substrate prior to and during the lead bonding process.

12 Claims, 2 Drawing Sheets

OUTER LEAD TAPE AUTOMATED BONDING SYSTEM

This application is a divisional of U.S. patent application Ser. No. 07/219,858, now U.S. Pat. No. 4,899,207, filed on July 14, 1988, which was a file wrapper continuation of U.S. patent application Ser. No. 06/900,789, filed on Aug. 27, 1986, now abandoned.

FIELD OF THE INVENTION

This invention relates to a new method of bonding an integrated circuit chip to a substrate and more particularly to a new method of bonding the outer leads of a tape and integrated circuit chip sub-assembly to a substrate.

BACKGROUND OF THE INVENTION

One step in the process of manufacturing an integrated circuit component is packaging. In packaging, a fabricated semiconductor chip is housed in a protective package. The assembled component can be tested and connected to the electronic circuit for which it was designed. The package is provided with external leads so the component can be electrically connected to the electronic circuit.

A difficult part of the packaging process is connecting the chip to the package's external leads. Care must be taken to insure that each bond or connection point on the chip is properly connected to the appropriate external lead. Failure to make all of the proper connections will result in a malfunctioning or nonfunctioning component.

A current method of connecting the chip to the package leads is Tape Automated Bonding (TAB). TAB employes a polyimide film, having a plurality of individual tape sites. Each site comprises a support ring of film defining a center aperture. A plurality of conductive fingers formed by etching techniques, underlie the support ring. Each conductive finger has an inner lead that extends into the center aperture and an outer lead that extends beyond the outer perimeter of the support ring. A chip is positioned over the aperture so that each bond point on the chip is in registration with the appropriate inner lead. The bond points are then bonded to the inner leads.

The tape-and-chip lead sub-assembly is then excised from the tape. The sub-assembly is positioned on a package substrate so that the outer leads are aligned over appropriate package substrate leads which connect to package external leads of the package. Bonding of the outer leads to the substrate leads then connects the chip to the appropriate package external leads.

More thorough discussions of the Tape Automated Bonding process are set forth in Sze, edit., *VLSI Technology*, (1983) pp. 559-564, and in Dais, Erich, and Jaffe, "Face-Down TAB for Hybrids," *IEEE Transactions on Components, Hybirds and Manufacturing Technology* (Dec. 1980) pp. 623-633, which are incorporated herein by reference.

Tape Automated Bonding is an efficient way to connect semiconductor chips to packages. The tape sites can be arranged on the tape to allow for automatic bonding of chips to the tape. By proper etching of the tape, the conductive fingers for each chip can be densely packed at the tape site. This feature is very important in the fabrication of Very Large Scale Integration (VLSI) chips, where often there are 100 to over 300 bonding points per chip.

However, it has proved difficult to align and bond the densely packed tape outer leads to the package substrate leads. There are three reasons for this; (1) curling forces in the leads are different along the tape in-line and across-the-line axes; (2) curling of the metal conductive fingers and the film on which they are etched is different and causes the leads of the sub-assembly to curl; and finally, (3) there is x-y sliding of the individual outer leads when a thermode bonding blade is pushed down on them. This curling and sliding make it difficult to keep the outer leads aligned prior to substrate bonding.

Outer lead curling and sliding also make it difficult to inspect the tape-and-chip sub-assembly prior to lead bonding. To prevent the outer leads from curling out of alignment, it is necessary to promptly bond the outer leads to the substrate leads. Any errors, such as fine misalignment, must be corrected by later inspection and rebonding.

These problems are relatively easy to correct and control when there are 10-100 outer leads per sub-assembly, and there is a lead pitch of more than 0.012 inch. However, VLSI sub-assemblies have 100 or more leads per sub-assembly. The outer leads are densely packed together, i.e., have a finer pitch between leads As a result, it is very difficult to align and bond the tape outer leads of a VLSI TAB sub-assembly to package substrate leads. This has been a major obstacle to the efficient manufacture of VLSI components.

A need, therefore, exists for a new method of bonding the outer leads of the conductive fingers leads of a tape-and-chip sub-assembly to the appropriate substrate leads. The new method should allow for the proper alignment of a large number of outer lead ends to the appropriate substrate leads, regardless of the density of the leads. The method should also prevent the curling of the outer leads prior to their being bonded to the substrate leads. Additionally, it should allow for the intermediate inspection of the sub-assembly after it is aligned on the substrate. This would allow for the correction of misalignment with the leads prior to bonding of the tape leads to the substrate. The new method of bonding should also prevent the outer leads from sliding when a bonding tool is applied to bond a tape outer lead to a substrate lead.

SUMMARY OF THE INVENTION

In accordance with this invention each tape site is provided with an outer support ring of film over the ends of the outer leads. Each tape-and-chip sub-assembly has a ring of inner leads, an inner support ring, a ring of exposed outer leads, and an outer support ring adhered to the tips of the outer lead ends. The outer support ring restrains the outer lead ends from curling prior to their being bonded to a substrate.

The substrate is prepared for the sub-assembly by first applying deposits of hot, adhesive, viscous flux to the package substrate bonding pad. The substrate is heated so the flux remains adhesive. The tape-and-chip sub-assembly is positioned over the bonding pad in contact with the flux deposits and with the tape outer leads in register with the appropriate package substrate leads. Next, the substrate is cooled to harden the flux. The hardened flux binds the tape outer support ring to the substrate, and keeps the tape outer leads in register with the substrate leads.

This process makes it relatively easy subsequently to bond the tape outer leads to the substrate leads. In this respect the outer support ring serves two functions Initially, it restrains the outer leads, in particular it prevents them from curling. Secondly, after the outer support ring is bonded to the substrate, it holds the outer leads in registration with the substrate leads. This provides an intermediate opportunity to thoroughly inspect the leads prior to bonding, since there is little possibility of the outer leads curling or otherwise coming out of alignment with the substrate leads. If any faults are detected, there is then an opportunity to correct them prior to the bonding operation. Since movement of the leads are restricted, it is a relatively easy task to use micro tools to correct any faults discovered.

The outer support ring also prevents the outer leads from sliding out of position when a bonding tool is applied to bond the leads to the substrate leads.

The foregoing process is especially suited to the manufacture of VLSI components.

DETAILED DESCRIPTION OF THE PREFERRED EMBODIMENTS

Figure 1:
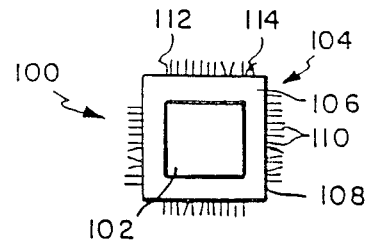
FIG. 1 is a plan view of a tape-and-chip sub-assembly according to the prior art.

FIG. 1 illustrates a prior art tape-and-chip sub-assembly 100. A chip 102 is bonded to a tape section 104. The tape section comprises a single support ring 106 that has a number of conductive fingers 108 etched on its underside. Each conductive finger has an outer lead 110 that extends beyond the outer perimeter of the support ring and inner leads (not shown) that underlie and are bonded to the chip 102. The outer leads are not restrained, and in handling, the individual leads may curl or become crossed as at 112 and 114, respectively. As a result, it is necessary to promptly bond the leads to a substrate without first inspecting and correcting for open, short, or misaligned leads. Furthermore, there is nothing to prevent individual outer leads from sliding out of position when a bonding tool is applied to connect the outer leads to the substrate leads.

Figure 2:
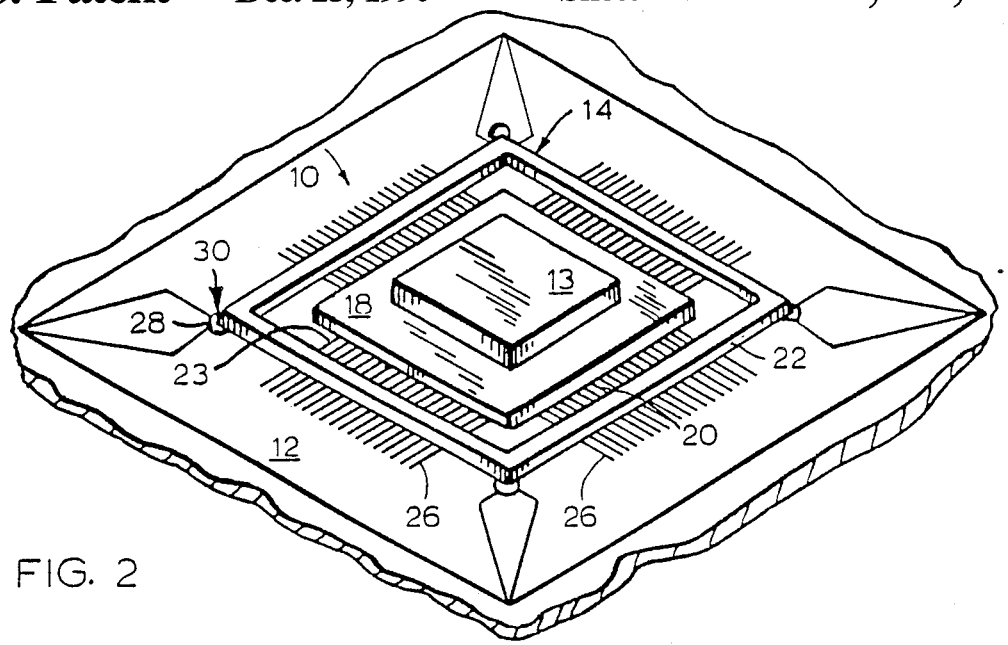
FIG. 2 is an isometric view of a tape-and-chip sub-assembly aligned on a package substrate according to the preferred embodiment of this invention.

FIG. 2 illustrates a tape-and-chip sub-assembly 10 bonded to a package substrate 12 according to this invention. The tape and chip sub-assembly 10 comprises a semiconductor chip 13 bonded to an excised section of lead tape 14. A plurality of conductive fingers 16 are etched on the underside of the lead tape 14. There are a sufficient number of fingers to make the necessary extended electrical connections between the chip 13 and the substrate 12. More specifically, the conductive fingers 16 extend out from a square-shaped inner support ring 18 of polyimide film extending around the semiconductor chip 13. Each conductive finger has a distally located outer lead 20. Over the ends of the outer leads 20 is a square-shaped outer support ring 22, also of polyimide film. The inner perimeter of the outer support ring 22 is spaced away from the outer perimeter of the inner support ring 18 to expose portions 23 of the outer leads 20 therebetween.

The tape-and-chip sub-assembly 10 is located on a substrate mounting pad 24. Embedded on the substrate mounting pad 24 are substrate leads 26 that are connected to package external leads, (not shown). The tape and chip assembly 10 is positioned over the substrate 12 so that each outer lead 20 is aligned with the appropriate substrate lead 26. The tape-and-chip sub-assembly 10 is held to the substrate 12 by deposits of flux 28 at the corners 30 of the outer support ring 22.

Figure 3:
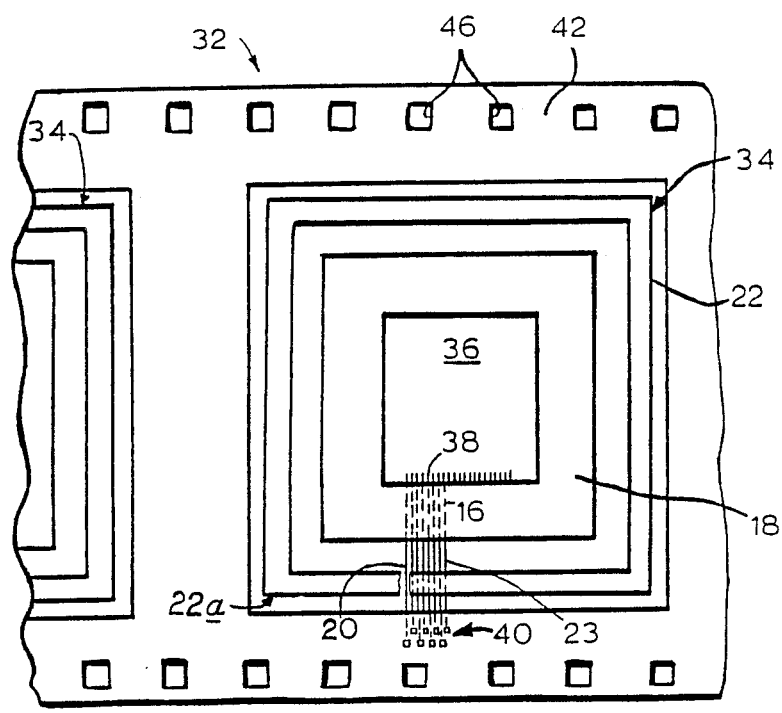
FIG. 3 is a plan view of a section of lead tape according to the preferred embodiment of this invention.

As best seen in FIG. 3, a tape 32 used in this process is made of polyimide and contains a plurality of individual tape sections 34 arranged serially.. The conductive fingers 16 are etched on the undersides of the individual tape sections. The inner support ring 18 and outer support ring 22 are formed by etching so as to expose the portion 23 of outer leads 20 therebetween. A central aperture 36 is etched from the inner support ring 18 to expose an inner lead 38 that extends from each conductive finger 16. Each conductive finger 16 extends beneath the inner support ring 18 and the outer support ring 22, and terminates in a test pad 40 located adjacent to the outer perimeter of the tape section 34. The tape 32 has sides 42 that are provided with section 34. The tape 32 has sides 42 that are provided with sprocket holes 48.

The semiconductor chip 13 is mounted in the central aperture 36 of each tape section 34 according to standard TAB mounting practices. The sprocket holes 46 are provided so the tape 32 can be mechanically advanced through a TAB chip bonding machine (not shown). During chip bonding, the inner leads 38 are connected to the appropriate bond points on the chip 13. The test pads 40 facilitate testing of the tape-and-chip connections after bonding. After inner-lead bonding and testing, the tape-and-chip sub-assemblies 10 are excised from the tape 32 along the outer edges of the outer support ring 22.

Figure 5:
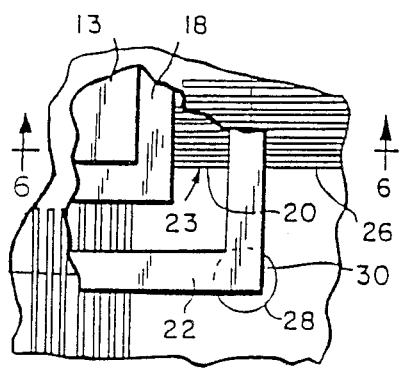
FIG. 5 is an enlarged plan view of a corner portion of the tape-and-chip sub-assembly of FIG. 2.
Figure 6:
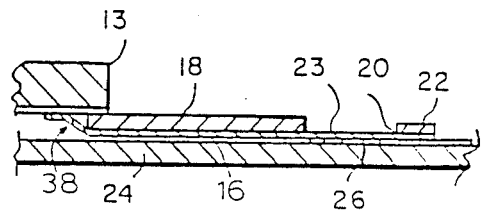
FIG. 6 is a cross-sectional view of the tape-and-chip sub-assembly taken along line 6—6 in FIG. 5.
Figure 4:
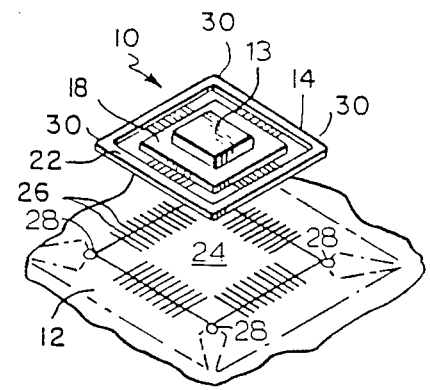
FIG. 4 is an exploded isometric view illustrating the alignment of a tape-and-chip sub-assembly to a package substrate according to the preferred embodiment of this invention.

The first step in bonding the tape-and-chip sub-assembly 10 to the substrate is to apply deposits of flux 28 to the substrate 12, as FIG. 4 illustrates. The flux 28 is applied on the substrate at locations where the outer support ring 22 is to be in contact with the substrate 12 and where the outer leads 20 and substrate leads 26 are not to be bonded together. For example, this may be where the outer support ring corner regions 30 are over the substrate, as FIG. 5 and FIG. 6 illustrate. The preferred type of flux 28 is a rosin-paste flux, from which the solvents, such as butyl carbitol and benzyl alcohol, have been evaporated. This results in a flux 28 that is hard below 100° C. and adhesive and viscous in the range of 120° C.-150° C. The flux 28 is applied to the substrate 12 at a temperature of approximately 125° C. An automated "pogo pin/reservoir" system may be used to apply the flux 28 to the substrate 12. The substrate 12 is kept heated to approximately 125° C. to insure that it remains adhesive but does not flow over the substrate.

The tape-and-chip sub-assembly 10 is then placed on substrate 12. Using TAB assembly techniques the tape-and-chip sub-assembly 10 is positioned so the outer leads 20 are in registration with the appropriate substrate leads 26. After the tape and chip sub-assembly 10 is properly aligned, the substrate 12 is cooled to harden the flux 28 and thereby secure the outer ring 22 to the substrate 12 in the proper position. The outer support ring 22, in turn, maintains the individual tape outer leads 20 in position, as FIG. 6 illustrates.

After the tape-and-chip sub-assembly 10 is flux-bonded to the substrate 12, the outer leads 20 can be inspected. Since the outer leads 20 are restrained from moving, the bonded assembly can be thoroughly inspected for openings, shorts, and fine misalignments. Any defects can be repaired by a warm probe. After the assembly has been inspected and, if necessary repaired, the 26 outer leads 20 can then be bonded to the substrate leads 26 using standard micro-bonding techniques. During the outer lead bonding process, the outer support ring 22 prevents the outer leads 20 from sliding when the bonding tool (not shown) is applied. The tape and chip sub-assembly 10 is then available for the final steps of the packaging process.

The method of alignment and bonding of this invention is especially suited to the manufacture of VLSI components. The outer support ring 22 can restrain the movement of any number of individual outer leads. Flux bonding the tape-and-chip sub-assembly 10 to the substrate 12 keeps the outer leads 20 aligned during the inspection and lead bonding process. This significantly reduces the amount of effort required to bond the outer leads to a substrate, even though the leads may be densely packed together. These features are important when manufacturing a VLSI component that has a large number of leads in a small space.

What is claimed as new and desired to be secured by Letters Patent of the United States is:

1. A method of bonding a lead tape-and-chip sub-assembly to a package substrate, the lead tape having a plurality of conductive fingers electrically connected to the chip, each conductive finger having an outer lead that is distally located from the chip and is to be bonded with an associated substrate lead on the package substrate, the method comprising the steps of:
   A. providing the tape-and-chip sub-assembly with a tape outer support ring overlying and adhered to the outer ends of the outer leads so as to restrict the movement of individual outer leads;
   B. positioning the tape-and-chip sub-assembly on the substrate so that each individual tape outer lead is in registration with the associated substrate lead; and
   C. bonding the outer support ring to the substrate so as to restrain the movement of the aligned outer leads.

2. The method of claim 1 wherein the outer support ring is bonded to the substrate by applying an adhesive substance between the tape outer ring and the substrate at at least one selected location.

3. The method of claim 2 wherein the adhesive substance is a flux, the flux being hard below a first temperature and adhesive above a second temperature above the first temperature, and the tape outer support ring is bonded to the substrate according to the steps of:
   A. applying flux to at least one location on the substrate where the outer support ring is to be positioned over the substrate;
   B. heating the flux above the second temperature so that the flux is adhesive;
   C. positioning the tape-and-chip sub-assembly so that each tape outer lead is in registration with the associated substrate lead and the outer support ring is located in the flux; and
   D. cooling the flux to below the first temperature so the flux hardens and thereby bonds the tape-and-chip sub-assembly to the substrate.

4. The method of claim 3 wherein the at least one selected location to which the flux is applied is free of package substrate leads and tape outer leads.

5. The method of claim 4 wherein the outer support ring is a polygon, the tape outer leads are spaced away from the corners of the polygon, and at least one corner of the polygon is located in the flux.

6. The method of claim 3 wherein the flux is a rosin-pasted flux with the solvents therein removed.

7. A method of bonding a lead tape-and-chip sub-assembly to a package substrate, the lead tape having a plurality of conductive fingers electrically connected to the chip, each conductive finger having an outer lead that has an inner portion extending from an inner support ring and an outer end that is distally located from the chip, the method comprising the steps of:
   A. providing the tape-and-chip sub-assembly with a tape outer support ring overlying and adhered to the outer ends of the outer leads so as to restrict the movement of individual outer leads;
   B. positioning the tape-and-chip sub-assembly on the substrate so that each individual tape outer lead is in registration with an associated substrate lead on the package substrate;
   C. bonding the outer support ring to the substrate so as to restrain the movement of the aligned outer leads; and
   D. bonding the inner portions of the outer leads to the associated substrate leads on the package substrate.

8. The method of claim 7 wherein the outer support ring is bonded to the substrate by applying an adhesive substance between the tape outer ring and the substrate at at least one selected location.

9. The method of claim 8 wherein the adhesive substance is a flux, the flux being hard below a first temperature and adhesive above a second temperature above the first temperature, and the tape outer support ring is bonded to the substrate according to the steps of:
   A. applying flux to at least one location on the substrate where the outer support ring is to be positioned over the substrate;
   B. heating the flux above the second temperature so that the flux is adhesive;
   C. positioning the tape-and-chip sub-assembly so that each tape outer lead is in registration with the associated substrate lead and the outer support ring is located in the flux; and
   D. cooling the flux to below the first temperature so the flux hardens and thereby bonds the tape-and-chip sub-assembly to the substrate.

10. The method of claim 9 wherein the at least one selected location to which the adhesive is applied is free of package substrate leads and tape outer leads.

11. The method of claim 10 wherein the outer support ring is a polygon, the tape outer leads are spaced away from the corners of the polygon, and at least one corner of the polygon is located in the flux.

12. The method of claim 9 wherein the flux is a resin-pasted flux with the solvents therein removed.

* * * * *